United States Patent [19]

Wallestad

[11] 3,923,156

[45] Dec. 2, 1975

[54] WAFER BASKET

[75] Inventor: Victor C. Wallestad, Edina, Minn.

[73] Assignee: Fluoroware, Inc., Chaska, Minn.

[22] Filed: Apr. 29, 1974

[21] Appl. No.: 465,337

[52] U.S. Cl. .................. 206/454; 206/73; 206/328; 211/40; 118/500

[51] Int. Cl.² ......................B65D 57/00; B65D 85/30; B05C 11/14

[58] Field of Search ............. 206/455, 521, 332, 73, 206/454, 328; 211/41, 40, 126, 71; 294/33; 118/500

[56] References Cited

UNITED STATES PATENTS

| | | | |
|---|---|---|---|
| 1,764,754 | 6/1930 | Scott | 211/40 |
| 3,394,819 | 7/1968 | Saville | 211/126 |
| 3,467,242 | 9/1969 | Derousse | 206/521 |
| 3,473,670 | 10/1969 | Elftmann | 211/41 |
| 3,486,631 | 12/1969 | Rodman | 211/41 |
| 3,487,948 | 1/1970 | Haidegger | 211/41 |
| 3,534,862 | 10/1970 | Shambelan | 211/41 |
| 3,701,558 | 10/1972 | Baker | 294/33 |
| 3,828,726 | 8/1974 | Dietze et al. | 118/500 |

*Primary Examiner*—William T. Dixson, Jr.
*Attorney, Agent, or Firm*—James R. Haller; H. Dale Palmatier

[57] ABSTRACT

A wafer basket having slotted side walls to permit free circulation of liquids around wafers in the basket and drainage of the liquid from the basket. The slotted side walls have lower portions offset inwardly and defining wafer support surfaces contoured to the peripheral contour of the wafers and supporting the wafers over a substantial portion of their peripheries.

7 Claims, 10 Drawing Figures

WAFER BASKET

BACKGROUND OF THE INVENTION

The handling and storage of thin, delicate wafers for the semiconductor industry presents acute problems because of the high value of such wafers and because of their fragility. The wafers may be of very brittle material such as silicon and may be 4 inches in diameter but only a few thousandths of an inch in thickness.

The processing of such wafers may require them to be successively bathed in and drained free of liquids at temperatures on the order of 200° centigrade. Baskets or small racks of a size suitable to accommodate a particular size of wafer are used to carry or store a batch of wafers, and during processing the basket and stored wafers are commonly successively emersed in baths of such liquids. Such baskets have wafer-separating flanges and are most economically fabricated by molding of temperature-resistant plastics such as "Teflon PFA", a perfluoroalkoxy-substituted polytetrafluoroethylene resin. However, even this temperature-resistant plastic may be affected by the temperature extremes of the wafer-processing baths. As a result, weakening of the baskets may occur when hot, and there may be deformation due to handling and the load of the wafers carried in the baskets. Of course, rather minimal sectional thicknesses must be maintained in the molded baskets, making it difficult to offset the heat-producing weakening.

SUMMARY OF THE INVENTION

The invention relates to a wafer basket having side and end walls, the sides having slots to permit free circulation of liquids around the wafers and drainage of the liquids out of the basket.

The slotted side walls have lower portions offset inwardly and defining wafer support surfaces curved to the peripheral contour of the wafers, and engaging and supporting the wafers over a substantial portion of their peripheries. The offset walls minimize warping or sagging of the basket when the basket is subjected to high temperatures of processing fluids. The side walls have confronting ribs separating the wafers from each other and extending inwardly from the offset portions of the walls to provide maximum stability to wafers in the basket.

The ends of the basket may advantageously be U-shaped to generally follow the offset shape of the wall and to strengthen the basket against warping.

DETAILED DESCRIPTION OF THE INVENTION

Figure 1:
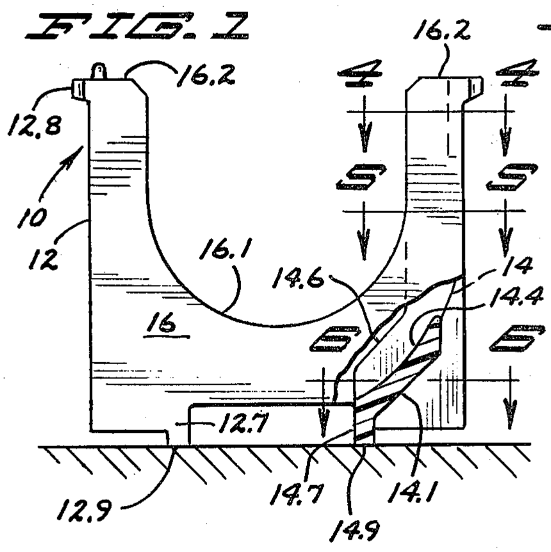
FIG. 1 is an end view of a basket of the invention shown in partial cross section.
Figure 3:
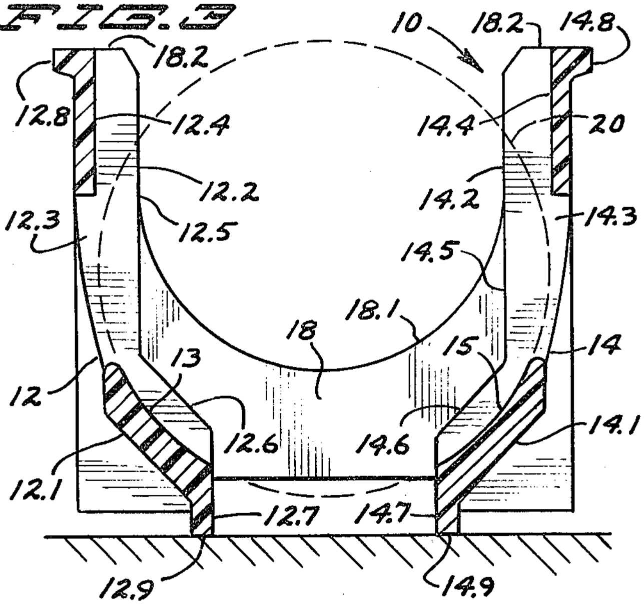
FIG. 3 is a cross sectional view taken along line 3—3 of FIG. 2 and showing a wafer, in phantom lines, contained in the basket.
Figure 2:
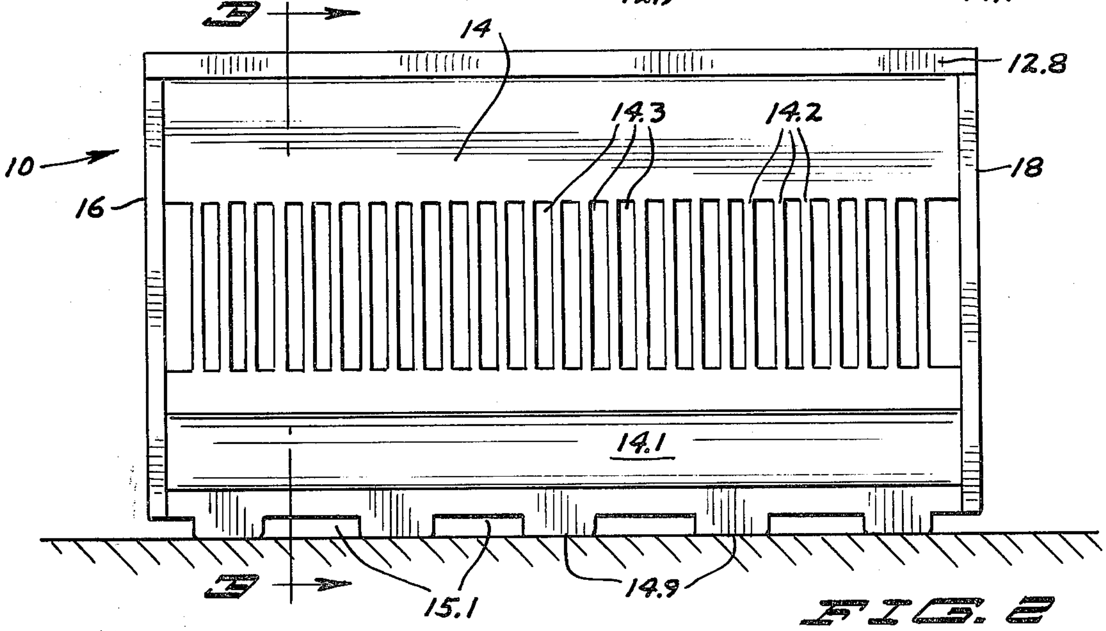
FIG. 2 is a side view of a basket of the invention.

Referring now to particularly FIGS. 1—3 of the drawing, a wafer basket of the invention is designated generally as 10 and is provided with opposing, generally parallel side walls 12 and 14 which are connected at their ends by end walls 16, 18. The side walls have lower portions 12.1, 14.1 which are offset inwardly as shown best in FIG. 3, the upwardly and inwardly facing surfaces 13, 15 of which are curved to the peripheral contour of a wafer, the latter being shown in phantom lines as 20 in FIG. 3. Spaced along each side wall are inwardly-projecting, wafer-separating ribs 12.2, 14.2, the ribs of one side wall being respectively aligned with the ribs of the other side wall. Intermediate its depth, each side wall is provided with a plurality of vertical slots 12.3, 14.3 which extend through the side walls between adjacent ribs, the slots permitting processing fluids to flow inwardly thereof for contact with the wafers during processing, and to permit the processing fluid to be drained from the basket. The side walls are spaced apart a sufficient distance so as to prevent the edges of wafers from protruding through the slots.

Figures 4, 5, 6:
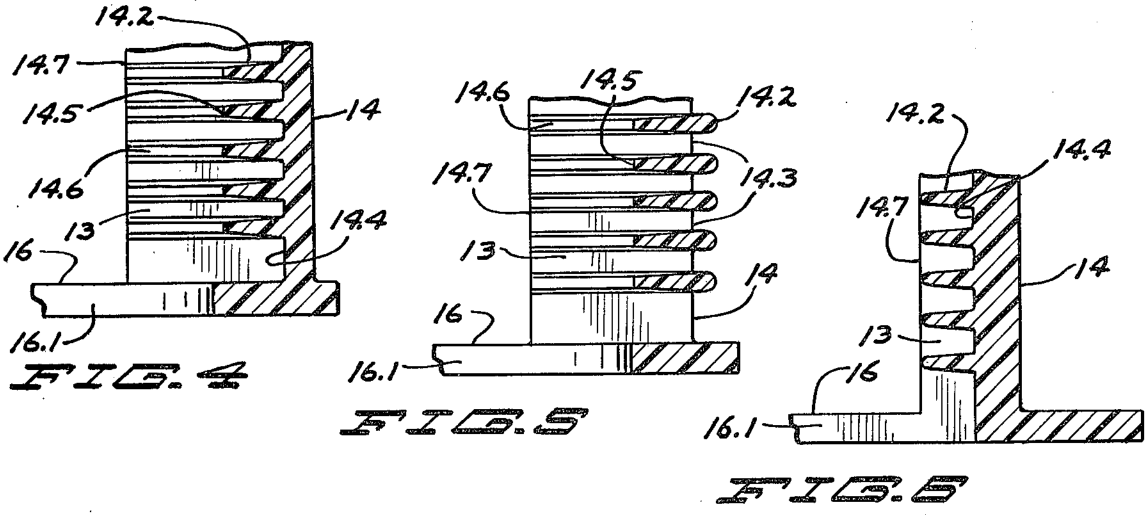
FIGS. 4, 5 and 6 are broken away cross sectional views taken along lines 4—4, 5—5 and 6—6 of FIG. 1, respectively.

As shown best in FIGS. 4–6, the ribs 12.2, 14.2 have inwardly tapering walls, and are spaced along the generally flat wall surface 12.4, 14.4. The width of the side walls 12.4, 14.4 between adjacent ribs is desirably slightly greater than the thickness of wafers to be held between the ribs, thus preventing the wafers from being squeezed between adjacent ribs. Also, the width of the slots 12.3, 14.3 between the ribs and adjacent the peripheries of the wafers is substantially greater, and desirably at least twice as great, as the thickness of the wafers to permit processing liquids to easily pass between the supported wafers and the slot walls.

As shown perhaps best in FIG. 3, the ribs 12.2, 14.2 extend substantially vertically downwardly from the upper surface of the side walls to provide vertical rib edges 12.5, 14.5 and then angle abruptly inwardly adjacent the lower wall portions 12.1, 14.1 to define substantially straight, upwardly and inwardly facing edges 12.6, 14.6. The inwardly offset lower wall portions 12.1, 14.1 terminate inwardly in spaced ends 12.7, 14.7 which provide the wafer basket with an open bottom through which processing liquids also can flow.

The upwardly and inwardly facing contoured surfaces 13, 15 of the lower wall portions 12.1, 14.1 provide a sustantial surface-to-surface contact with the wafers. Wafers of the type designed for use with baskets of the invention ordinarily are circular, as shown in FIG. 3, and it is thus desired that the upwardly and inwardly facing surfaces 13, 15 be circular in cross section throughout a substantial portion of their length so as to match the circular periphery of the wafers 20. The radii of curvature of the arcuate surfaces 13, 15 are the same, are struck from the same center, and are identical with the radius of the circular wafer 20.

The inwardly offset lower wall portions 12.1, 14.1, stiffen the basket and provide resistance against deformation caused by the very hot liquids to which the basket and wafers may be exposed during processing. Particularly, the offset walls tend to restrain the sides of the basket from bowing inwardly or outwardly, thus reducing the possibility of the basket walls to either crush the wafers between them or permit the wafers to become pinched or wedged between the spaced bottom wall portions 12.7, 14.7. Desirably, both the inner and outer surfaces of the lower wall portions are inwardly offset, as shown in FIGS. 1, 3, 7 and 9. The side walls 12 and 14 are spaced so that the distance between opposing wall surfaces 12.4, 14.4 is slightly greater than the diameter of the wafers to be carried in the basket; in this manner, the ribs along the substantially vertical, upper portions of the side walls serve primarily as guides to guide the wafers into the aligned spaces between the lower rib portions in the proximity of the inwardly offset lower side wall portions 12.1, 14.1.

The side walls 12, 14 desirably are provided with short, outwardly projecting stiffening flanges 12.8, 14.8, and the spaced lower side wall ends 12.7, 14.7 are provided with downwardly projecting feet 12.9, 14.9 which enable the basket to be supported on a plane, horizontal surface. The feet 12.9, 14.9 are preferrably spaced from one another to provide a series of openings 13.1, 15.1 between the bottom of the offset wall portions and the plane surface upon which the basket rests, these openings permitting processing liquids to flow freely into and out of the basket through its open bottom when the basket is resting on a horizontal support such as the bottom surface of a processing liquid tank.

In the embodiment depicted in FIGS. 1–6, the end walls 16, 18 have upper edges with centrally positioned, U-shaped depressions 16.1, 18.1 which are spaced inwardly of the junctions of the side walls with the end walls so as to leave spaced upper edge sections 16.2, 18.2 of the end wall 16, 18 at the top of the basket. The U-shaped depressions 16.1, 18.1 permit endwise access to the wafers through the end walls 16, 18. The U-shaped end walls 16, 18 generally follow the offset shape of the side walls 12, 14 and thus further strengthen the basket against warping. The U-shaped end walls may be of the type shown in my U.S. patent application Ser. No. 433,121, filed Jan. 14, 1974.

Figure 7:
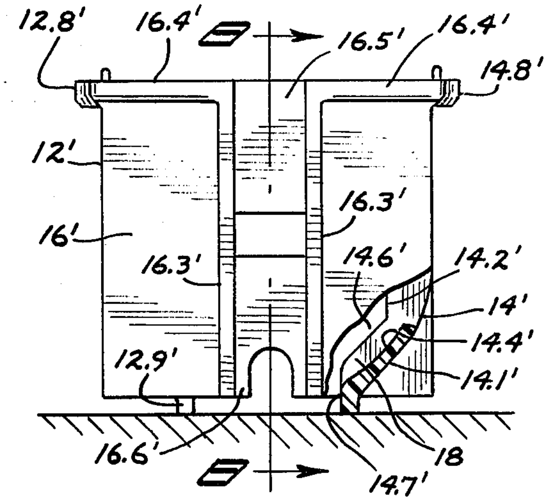
FIG. 7 is an end view of a basket of the invention having a modified end wall.
Figure 8:
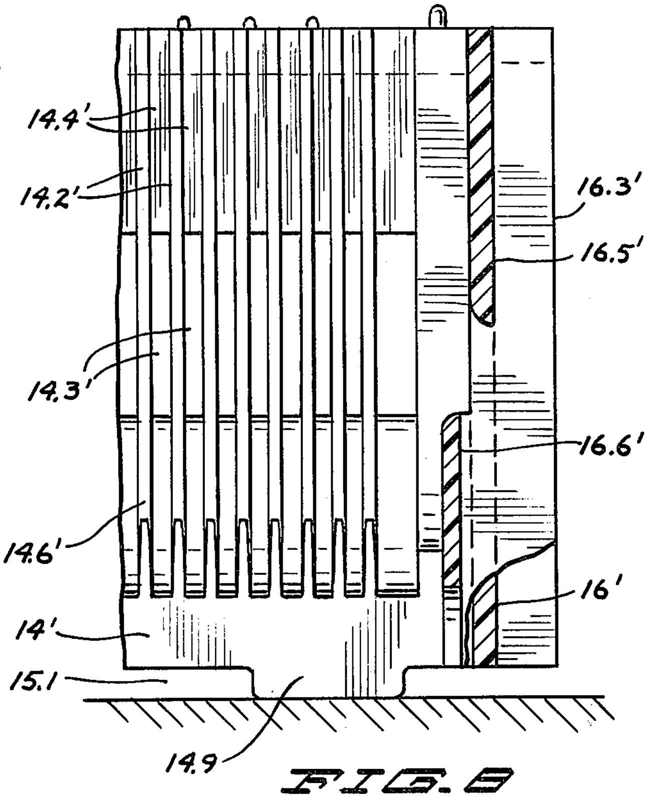
FIG. 8 is a broken away, cross sectional view taken along line 8—8 of FIG. 7.
Figure 9:
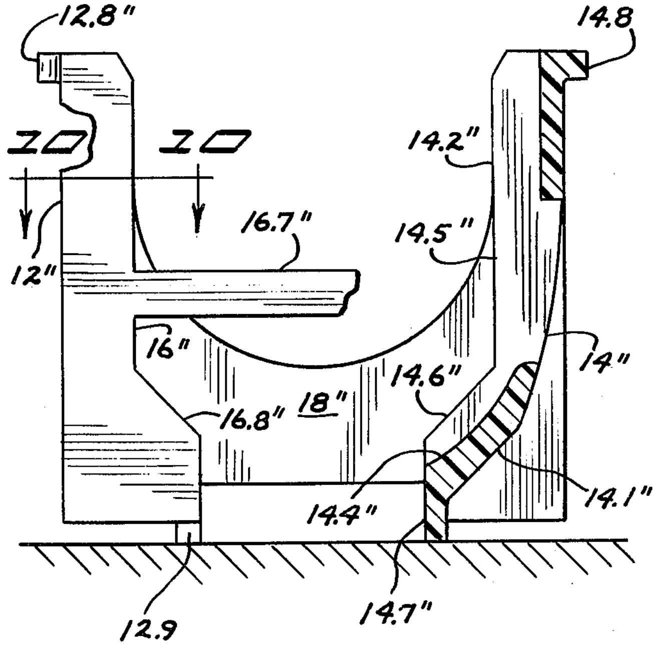
FIG. 9 is an end view in partial cross section showing yet another modified end wall of the invention.
Figure 10:
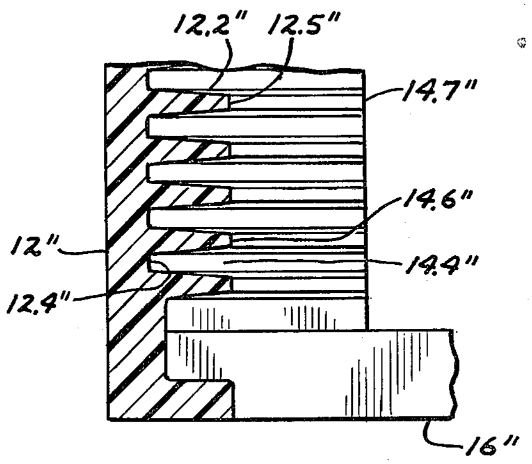
FIG. 10 is a broken away cross sectional view taken along the line 10—10 of FIG. 9.

In the embodiment depicted in FIGS. 7 and 8, the end walls 16′, 18′ are provided with axially outwardly flaring spaced vertical flanges 16.3′ which respectively merge upwardly into flange portions 16.4′ which extend horizontally from the vertical flanges to the edges of the end walls. Between the vertical flanges 16.3′ are vertically spaced end wall sections 16.5′, 16.6′, the latter being also spaced axially inwardly from the former to accommodate a detachable handle such as that shown in U.S. Pat. No. 3,701,558. In the basket shown in FIGS. 9 and 10, one end wall 18″ is U-shaped as shown in FIGS. 1–6, and the other end wall 16″ has a transverse connecting bar 16.7 between the respective side walls 12, 14, and positioned intermediate the height of the end wall 16″. The lower portions 16.8″ of the end wall 16′ are offset inwardly to generally follow the offset shape of the lower portions of the side walls and provide further resistance to warping. The connector bar 16.7″ may be of the type shown in my U.S. patent application Ser. No. 378,686, filed July 12, 1973.

Referring again to FIGS. 1 and 2, the lower side wall portions 12.1, 14.1 which are offset inwardly from the upper portions of the side walls extend inwardly well beyond the vertical rib edges 12.5, 14.5 so that the upwardly and inwardly facing arcuate surfaces 12.4, 14.4 are afforded significant peripheral contact with a wafer carried in the basket. The inwardly offset lower side wall portions thus not only provide the side walls with significant resistance to bending or bowing caused by heat-softening of the basket, but additionally afford upwardly and inwardly facing wafer support surfaces contoured to the wafers along a substantial portion of their peripheries to thus gently support the wafers during processing thereof.

Manifestly, I have provided a wafer basket with slotted, liquid-transmitting side walls having significant resistance to deformation when heated by hot processing liquids and which have contoured surfaces providing substantial peripheral support for the wafers.

While I have described a preferred embodiment of the present invention, it should be understood that various changes, adaptations, and modifications may be made therein without departing from the spirit of the invention and the scope of the appended claims.

What is claimed:

1. A wafer basket having opposed side walls for carrying axially aligned wafers therebetween, an open top through which wafers may be inserted and ejected, and end walls joining the side walls, the side walls having lower portions offset inwardly and defining wafer-support surfaces curved to the peripheral contour of the wafers to engage and support the wafers over a substantial portion of their peripheries, the side walls also having confronting ribs substantially throughout their heights separating the wafers from each other and extending inwardly on the offset portions of the walls to stabilize wafers in the basket, and the side walls having vertical slots to permit free circulation of processing liquids around the wafers and drainage of the liquids out of the basket.

2. The wafer basket of claim 1 wherein the side walls are spaced from one another a distance sufficient to prevent the periphery of a wafer carried in the basket from protruding outwardly through said vertical slots and wherein the curved wafer-support surfaces are arcuate and have radii of curvature equal to the radius of curvature of said wafer.

3. The wafer basket of claim 2 wherein the wafer-support surfaces extend inwardly of the basket well beyond inward edges of ribs adjacent the top of the side walls.

4. The wafer basket of claim 1 wherein at least one of the end walls is U-shaped to follow generally the offset shape of the side wall portions.

5. The wafer basket of claim 1 wherein at least one end wall includes a transverse connecting bar rigidly joining the side walls intermediate their heighths.

6. The wafer basket of claim 1 wherein at least one end wall has centrally positioned upper and lower, vertically spaced end wall sections defining a handle-receiving opening in the end wall.

7. A wafer basket having opposed side and end walls and an open top and bottom, the side walls having inwardly projecting, aligned, spaced ribs for separating wafers one from another and also having lower portions offset inwardly and defining upwardly and inwardly facing, arcuate wafer-support surfaces curved to the peripheral contour of the wafers and extending inwardly well beyond the inner edges of ribs adjacent the top of the basket to engage and support the wafers over a substantial portion of their peripheries, the ribs extending inwardly on the offset portions of the walls to stabilize wafers in the basket, the side walls having intermediate their heighths a plurality of vertical slots between the ribs and of sufficient width to permit processing fluid to enter and leave the basket through the slots around the peripheries of wafers carried in the basket, the offset side walls minimizing warping or sagging of the basket when the latter is subjected to high temperatures.

* * * * *